United States Patent
Beintner et al.

(10) Patent No.: US 6,933,183 B2
(45) Date of Patent: Aug. 23, 2005

(54) SELFALIGNED SOURCE/DRAIN FINFET PROCESS FLOW

(75) Inventors: Jochen C. Beintner, Wappinger's Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 10/731,584

(22) Filed: Dec. 9, 2003

(65) Prior Publication Data

US 2005/0124099 A1 Jun. 9, 2005

(51) Int. Cl.⁷ .............................................. H01L 21/84
(52) U.S. Cl. ...................... 438/157; 438/164; 438/283; 438/284; 257/347; 257/368; 257/401
(58) Field of Search ................................. 438/149, 151, 438/157, 164, 283, 284; 257/347, 368, 401

(56) References Cited

U.S. PATENT DOCUMENTS

| | | | | |
|---|---|---|---|---|
| 6,252,284 B1 | * | 6/2001 | Muller et al. | 257/412 |
| 6,342,410 B1 | * | 1/2002 | Yu | 438/164 |
| 6,413,802 B1 | * | 7/2002 | Hu et al. | 438/151 |
| 2004/0036126 A1 | * | 2/2004 | Chau et al. | 257/401 |

* cited by examiner

Primary Examiner—Trung Dang
(74) Attorney, Agent, or Firm—Eric W. Petraske

(57) ABSTRACT

A selfaligned FinFET is fabricated by defining a set of fins in a semiconductor wafer, depositing gate material over the fins, defining a gate hardmask having a thickness sufficient to withstand later etching steps, etching the gates material outside the hardmask to form the gate, depositing a conformal layer of insulator over the gate and the fins, etching the insulator anistotropically until the insulator over the fins is removed down to the substrate, the hardmask having a thickness such that a portion of the hardmask remains over the gate and sidewalls remain on the gate, and forming source and drain areas in the exposed fins while the gate is protected by the hardmask material.

13 Claims, 18 Drawing Sheets

SELF ALIGNED SOURCE/DRAIN FINFET PROCESS FLOW

TECHNICAL FIELD

The field of the invention is that of fabricating field effect transistors having a body extending perpendicular to the semiconductor substrate between horizontally disposed source and drain regions, referred to as a "FinFET".

BACKGROUND OF THE INVENTION

Metal-Oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling".

Ultra-large-scale integrated (ULSI) circuits generally include a multitude of transistors, such as more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_x Ge_{(1-x)}$) material that controls charge carriers in a channel region between the drain and the source to turn the transistor on and off. The transistors can be N-channel MOSFETs or P-channel MOSFETs.

In bulk semiconductor-type devices, transistors such as MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

As MOSFETs are scaled to channel lengths below 100 nm, conventional MOSFETs suffer from several problems. In particular, interactions between the source and drain of the MOSFET degrade the ability of the gate to control whether the device is on or off. This phenomenon is called the "short-channel effect".

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variations in small size transistors), near-ideal subthreshold voltage swing (i.e., good for low off-state current leakage), and high saturation current. SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this becomes increasingly difficult, since the distance between the source and drain is reduced, and hence, they increasingly interact with the channel, reducing gate control and increasing short channel effects (SCE).

The double-gate MOSFET structure is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing better gate control.

In a double gate field effect transistor (FinFET), the device channel comprises a thin silicon fin standing on an insulative layer (e.g. silicon oxide) with the gate in contact with the sides of the fin. Thus inversion layers are formed on the sides of the channel with the channel film being sufficiently thin such that the two gates control the entire channel film and limit modulation of channel conductivity by the source and drain.

The double gates on the channel fin effectively suppress SCE and enhance drive current. Further, since the fin is thin, doping of the fin is not required to suppress SCE and undoped silicon can be used as the device channel, thereby reducing mobility degradation due to impurity scattering. Further, the threshold voltage of the device may be controlled by adjusting the work function of the gate by using a silicon-germanium alloy or a refractory metal or its compound such as titanium nitride.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, active lines conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such as ultraviolet light, through an overlay mask. The portions of the photoresist mask exposed to the electromagnetic radiation react (e.g. are cured). The uncured portions of the photoresist mask are removed, thereby transposing the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately define the feature. For example, as described above, reduction of the width of the gate conductor (the gate length) associated with a transistor or of the active lines associated with an SOI transistor has significant beneficial effects. Future designs of transistors may require that the active lines have a width of less than 50 nanometers.

Double gate SOI MOSFETs have received significant attention because of its advantages related to high drive current and high immunity to short channel effects. The double-gate MOSFET as able to increase the drive current because the gate surrounds the active region by more than one layer (e.g., the effective gate total width is increased due to the double gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for an integrated circuit or electronic device that includes smaller, more densely disposed active regions or active lines. Further still, there is a need for a ULSI circuit which does not utilize conventional lithographic techniques to define active regions or active lines. Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple sided gate conductors associated with active lines having a width of about 20 to 50 nm.

SUMMARY OF THE INVENTION

The present invention is directed to a process for fabricating FinFET transistor structures, in which the source and drain are selfaligned to the gate.

A feature of the invention is that the gate is formed before source and drain contacts are made and the gate is encapsulated by a dielectric material.

Another feature of the invention is that the selfalignment provides better control of fringe capacitance and external resistance than prior art methods.

Another feature of the invention is that the gate is deposited in an aperture formed in a blanket dielectric.

Yet another feature of the invention is that the gate is fully silicided.

DETAILED DESCRIPTION

Figure 1A:
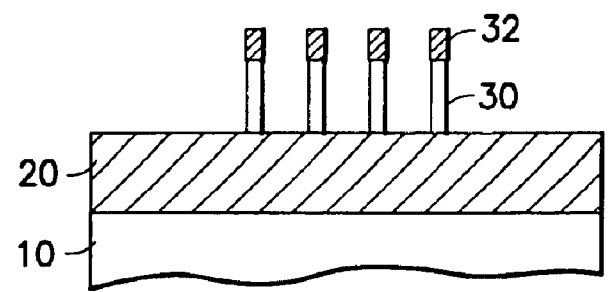
FIGS. 1–11 illustrates steps in the inventive process.
Figure 1B:
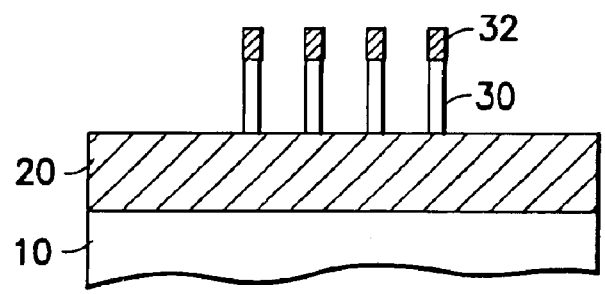
Figure 1C:
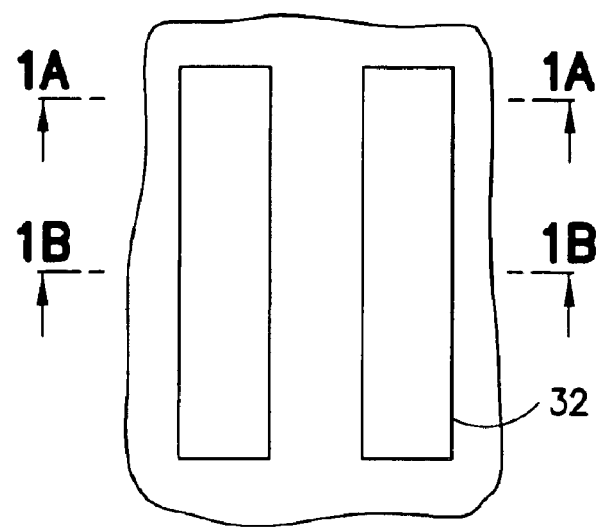

FIGS. 1A and 1B show cross sections of a set of fins 30 that will become the fins of a FinFET. As used herein, the term "set" means one or more; i.e. a FinFET may have one or more fins. FIG. 1C shows the location of the cross sections of FIGS. 1A and 1B. In this example, the four fins shown will be controlled by a common gate. Those skilled in the art will be aware that separated gates could be formed to control one or more fins, if desired. The Figure shows the result of conventional preliminary steps, well known to those skilled in the art, of forming the silicon fins for a FinFET.

Narrow fin structures in silicon or silicon on insulator (SOI) can be fabricated in different ways, e.g. by optical lithography followed by different trimming techniques (resist trimming, hard mask trimming, oxidation trimming). These processes are based on width reduction of the mask by plasma etch or wet etch, or by material consumption of the fin by oxidation)), by E-beam lithography or by sidewall image transfer processes.

In this example illustrated, the sidewall image transfer process is used as the method to structure narrow fins in SOI. FIG. 1 shows a bulk wafer 10, having a buried oxide (BOX) 20 with an SOI layer 30 of 70 nm (Possible range of the SOI is ~10 nm to 200 nm, but not limited to that range). The surface of layer 30 has been oxidized to form 300 Å of thermal oxide 32 (Preferred range 50 Å–500 Å). Alternatively, an oxide can also be deposited using any kind of CVD processes.

The following discussion illustrates a conventional method, well known to those skilled in the art, of fabricating the structure shown in FIG. 1. Other methods may also be used. These initial steps are not illustrated in the Figures to avoid unnecessary detail. Initially, 1500 Å (Preferred range 500 Å–3000 Å) of amorphous silicon were deposited on the wafer surface that will be formed into the fins (oxide layer 32 on top of fin layer 30) by CVD or sputter processes, followed by the deposition of 500 Å (Preferred range 1000 Å–2000 Å) of CVD oxide as a hardmask. Optical lithography and RIE etch processes are used to structure the oxide hardmask and the amorphous silicon layer, stopping on the oxide layer 32 on top of the SOI. Then a 200 Å (Preferred range 50 Å B 500 Å) nitride layer (not shown) is deposited conformally using a CVD process followed by a RIE etch process to form SiN spacers on the side of the amorphous silicon.

The amorphous silicon is then removed with a plasma etch or wet etch leaving nitride spacer structures behind. The spacer structures are used as a hardmask to structure the oxide 32 underneath and can be removed afterwards by oxide and silicon selective plasma etches or wet etches (e.g. hot phosphoric acid). The structured oxide 32 is then used as a hardmask to etch the silicon fins 30 in the SOI layer. Next, a sacrificial oxide is thermally grown to remove RIE damage from the silicon fin surface and to act as a screen oxide for fin body doping implants that can be processed at this point. Fin body doping implants are not necessary to make the FinFET device work, but can be useful to set FinFET Vt.

The sacrificial oxide is removed by a wet etch, followed by a preclean and gate oxide processing using thermal oxidation or CVD deposition processes.

A specific example of the process described above is shown in patent application Ser. No. 10/730,234, assigned to the assignee hereof and incorporated herein by reference and omitted from this description for simplicity.

The result of these preliminary steps is shown in FIG. 1. FIG. 1C shows a top view of a sample structure indicating cross sections 1A and 1B shown in FIGS. 1A and 1B, respectively. For convenience in explanation, the top of FIG.

1C will be referred to as North, with other directions corresponding. Thus, FIG. 1A is a cross section taken at the North end of the fins, looking north. The central portion of FIG. 1C will be the location of the self-aligned gate constructed according to the invention.

Referring now to FIG. 2, a polysilicon layer 40 of 1500 Å (Preferred range 500 Å to 3000 Å, depending on total fin height) is deposited using a CVD process and then planarized by a CMP or planarizing coating/etchback processes to improve the process window of the gate lithography step later in the process. Optional poly pre-doping to adjust the gate workfunction for NFETs and PFETs is followed by a low temperature CVD deposition of 1200 Å nitride 45 that forms a protective cap.

As explained below, the total height of a hardmask formed by layer 45 needs to be greater than silicon fin 30 height, plus the oxide 32 on the fin, plus a process margin. Before the nitride deposition, an optional oxide layer (Preferred range 20 Å–500 Å) can be deposited to act as a stress buffer between the nitride and the polysilicon.

Figure 2A:
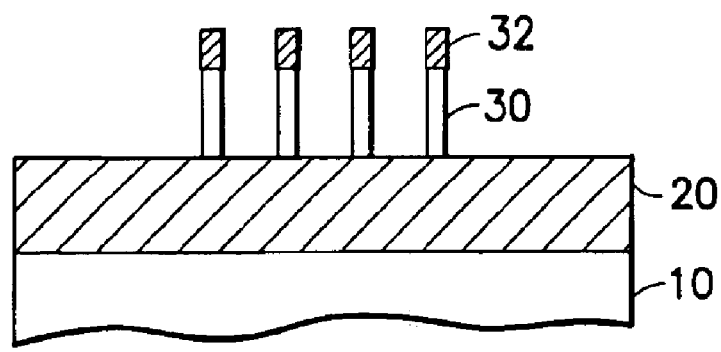
Figure 2B:
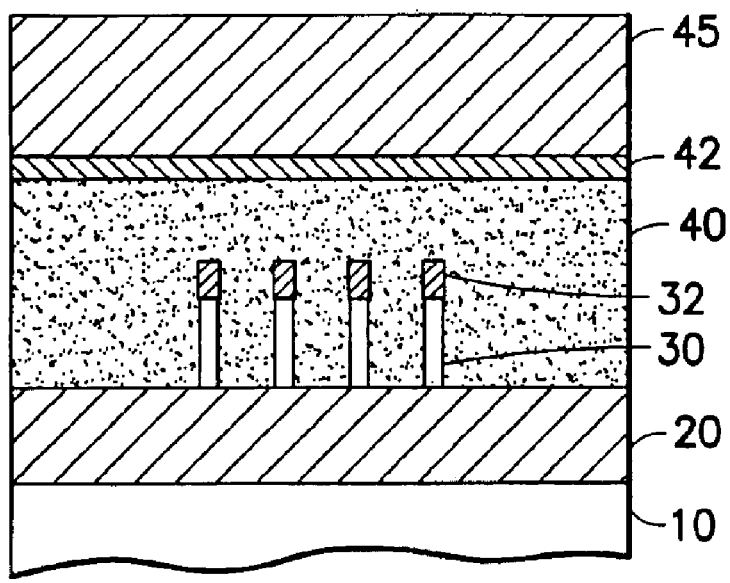
Figure 2C:
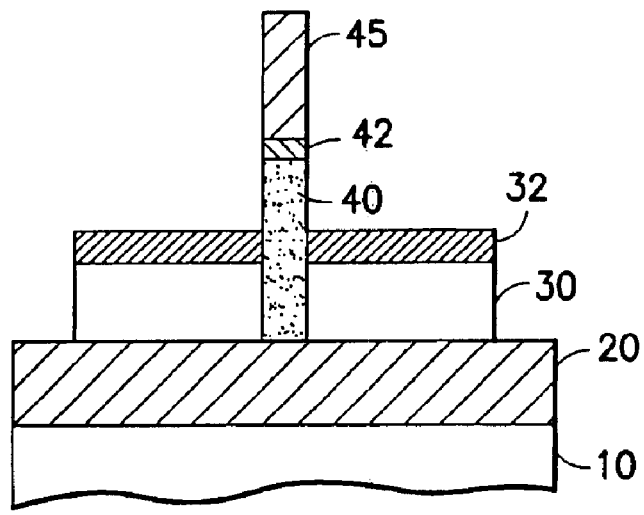
Figure 2D:
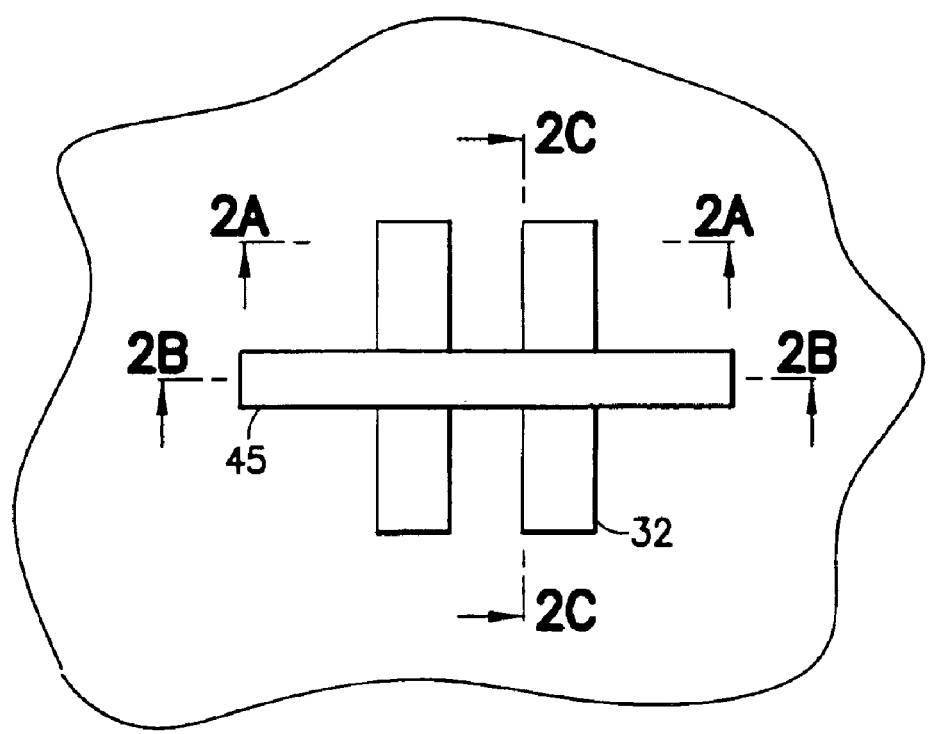

Nitride 45 is structured using optical lithography (the area shown as box PC in FIG. 2D), e-beam lithography or sidewall image transfer processes, and RIE to form a poly structure extending E-W that will define the selfaligned gate. With this structure as a nitride hardmask, poly 40 is etched by RIE down to BOX 20 to define the gate, leaving the fins 30 standing exposed in the S/D area. The result of the litho step is that FIG. 2A shows the same view as FIG. 1A, while FIG. 2B shows the poly structure capped by a nitride hardmask. FIG. 2C shows a view looking E along the poly structure. The fin 30 extends horizontally in this view and the gate extends perpendicular to the plane of the paper, with the plane of the cross section within the poly structure and outside the fin. If a gate width that is sub-litho is desired, trimming of the nitride hardmask 45 on top of the polysilicon can be done by resist trimming techniques or by nitride wet etch or dry etch processes.

Figure 3A:
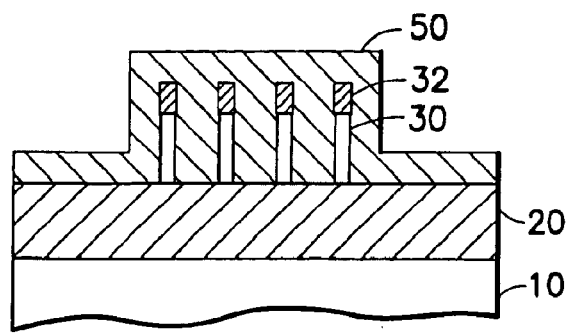

The next steps after the poly gate 40 is formed are 30 Å gate sidewall oxidation (Preferred range 0 Å to 100 Å), 50 Å CVD oxide liner deposition (Preferred range 0 Å to 500 Å) and implantations to process conventional halo and extension implants, well known to those skilled in the art. Then an encapsulating CVD nitride layer 50 is deposited with a thickness of 500 Å (Preferred range 50 Å to 1000 Å) as shown in FIG. 3. (The notation used is that a thickness of 0 indicates that the layer may be omitted.) The nitride has a thickness on the vertical edges of gate 40 optimized for the fringe capacitance/external resistance trade off and to offset the Source/Drain implants from the gate to adjust for source/drain dopant diffusion during later thermal processes. Depending on the distance between each fin, the nitride may fill up the space between the fins completely, as shown in FIG. 3A. In FIG. 3 and the following figures, Figures n-A and n-B will have the same orientation as FIGS. 1A and 1B, respectively.

Figure 3B:
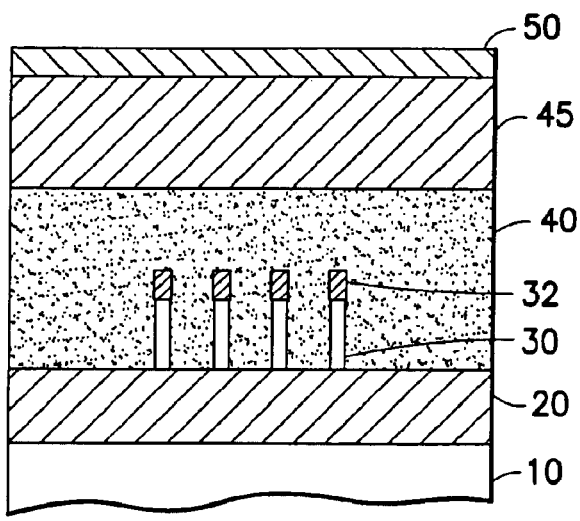
Figure 3C:
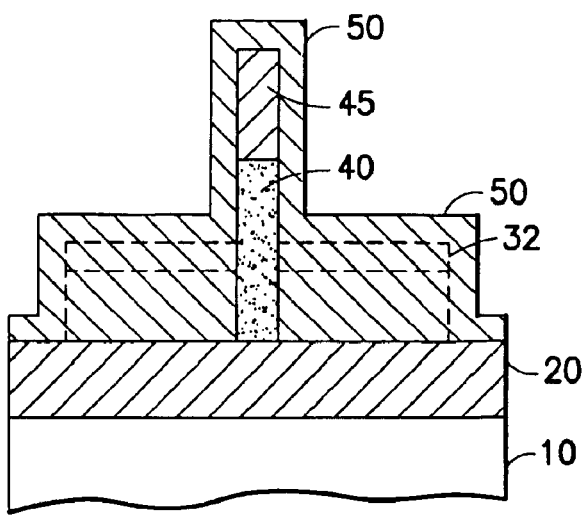

Since the nitride has a thickness that is ten times that of the gate sidewall oxide and oxide liner, these three layers are shown schematically by layer 50, to avoid a confusing multiplicity of lines in the Figure. FIG. 3B shows layer 50 as resting on layer 45. FIG. 3C shows layer 50 covering the top and sides of nitride 45 and the top and sides of the fin 30, extending N-S along fin 30 over the full height of the fin.

Figure 4A:
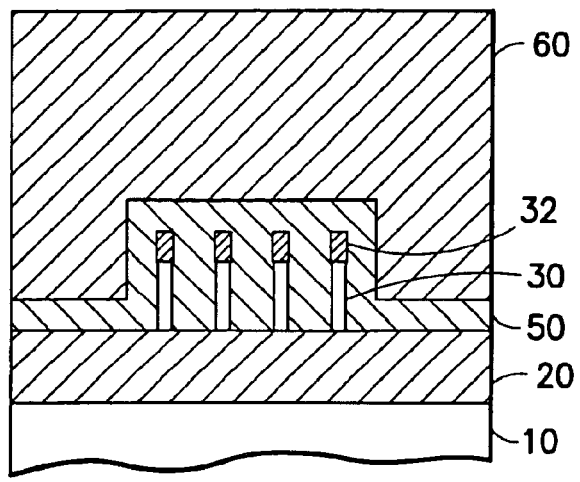
Figure 4B:
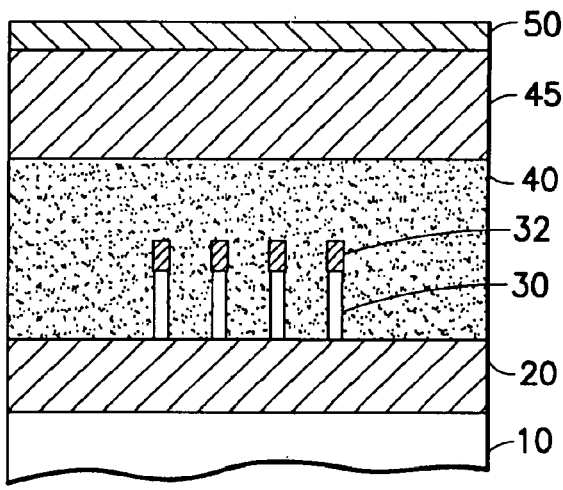
Figure 4C:
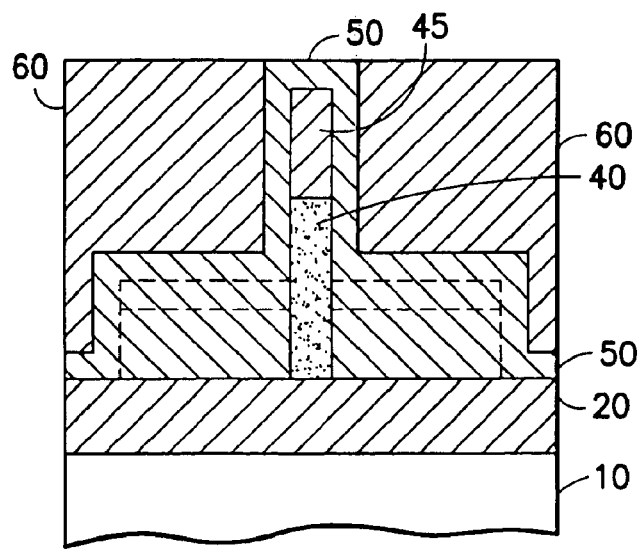
Figure 5A:
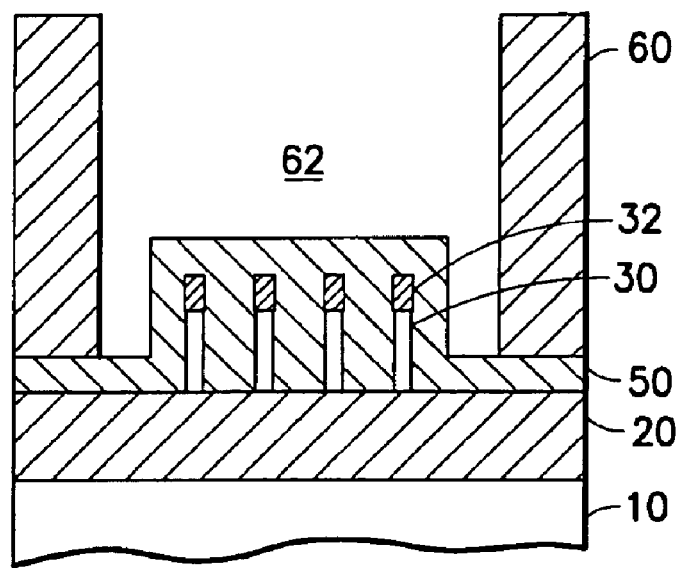
Figure 5B:
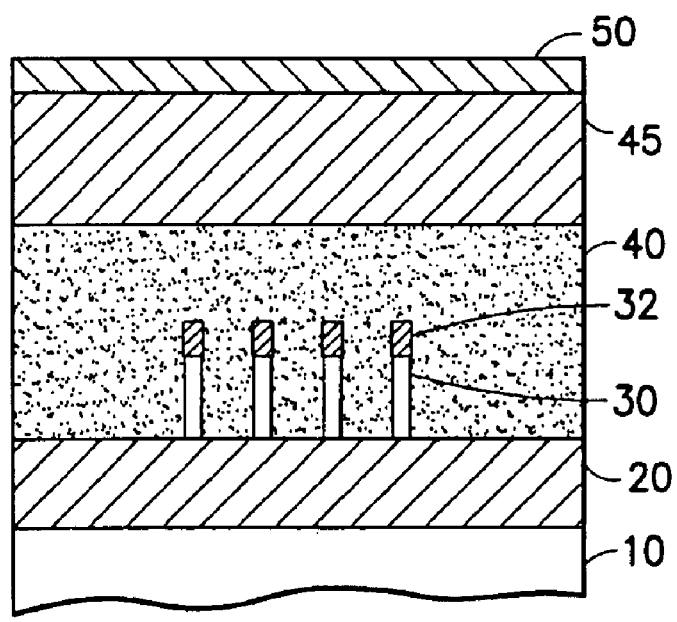
Figure 5C:
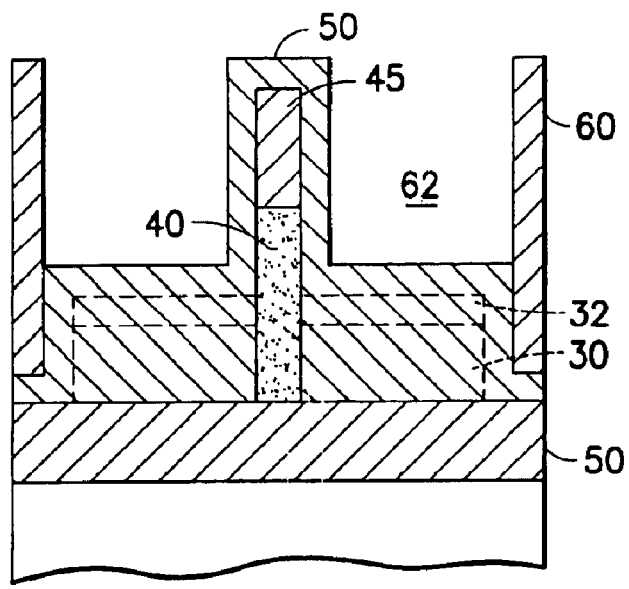
Figure 5D:
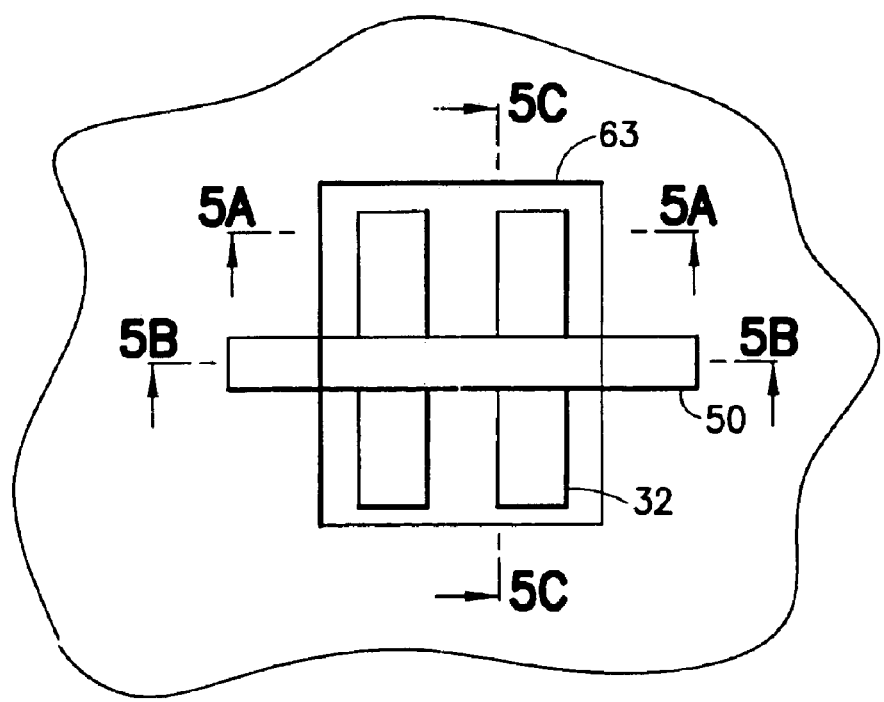

A CVD oxide 60 is then deposited covering the entire structure and planarized by CMP or any other planarization technique, preferably stopping on the nitride layer 50 on top of the gate nitride cap 45. The cap is the remaining nitride from the nitride hardmask on top of the polysilicon gate. The result is shown in FIG. 4, with the oxide 60 covering the nitride in. FIG. 4A and extending up to the top of the nitride cap in FIG. 4C, filling the area up to the level of the top of the nitride 50 in FIG. 4C. FIG. 4B is the same as FIG. 3B, since oxide 60 is removed down to the top of nitride 50.

FIG. 5 shows the result of a lithography process that structures the area for source/drain formation followed by an anisotropic, nitride selective oxide etch stopping on the bottom nitride 50. FIG. 5D shows a rectangle 63 that covers the fins in the example, ending before it reaches the limit of the litho rectangle that defines the gate and a rectangle 61 that represents the gate structure. FIG. 5A shows the fins at the N end, in which there is an opening 62 between the remaining portion of the oxide fill. FIG. 5C shows a portion of the same aperture, stopping in both FIGS. 5A and 5C on nitride 50. FIG. 5B is unchanged, because the aperture is not as wide as the view in this cross section and the oxide has been planarized to the top of the nitride 50 in FIG. 5B.

The purpose of oxide 60 is to protect etch defined source/drain areas that are isolated from each other by the oxide, such as NFETs in the following step. The oxide can be compared with an oxide deposited and structured to form contacts, as is done in the back end wiring.

Figure 6A:
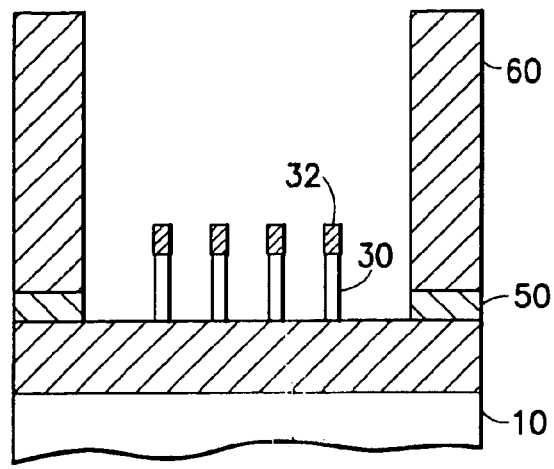
Figure 6B:
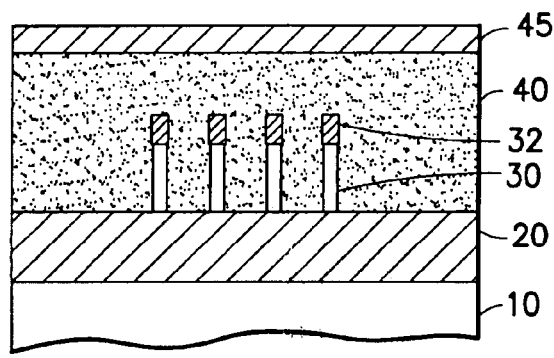
Figure 6C:
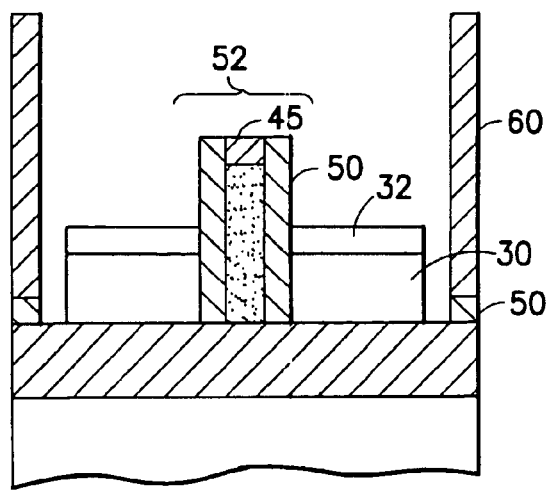

In FIG. 6, the nitride layer 50 that was deposited in FIG. 3 is anisotropically etched selective to oxide to remove material from the top and to form spacers on the two sides of the gate 40, (FIG. 6C). The etch is continued with an overetch of the nitride spacer sufficient to clean up the sidewalls of the fins (FIG. 6A), showing the silicon 30 of the fins exposed. The nitride cap 45 on top of the poly gate 40 needs to have a thickness sufficient to withstand the overetch, so that FIG. 6B shows a remaining nitride cap 45.

At this point an optional second spacer material can be deposited, e. g. CVD oxide (Preferred range 50 Å–1000 Å). The oxide spacer can be formed by RIE selective to nitride and silicon and the spacer can be removed by lithographic area definition and plasma or wet etch in certain areas where it is not required. The second spacer can also be formed before the nitride spacer is etched, resulting in the following sequence: oxide deposition on top of nitride, oxide spacer etch and area selective removal, nitride spacer etch. Bracket 52 indicates schematically the extra width of the extra oxide spacer.

If the optional oxide is chosen, the spacer will have two layers—nitride and oxide. FIG. 6C shows spacer 50 extending in the E-W direction to separate gate 40 from the S/D contacts.

The second spacer can be used to adjust for different diffusivity of Arsenic in the NFET and Boron in the PFET. As Boron diffuses faster, the source/drain offset from the gate in the PFETs needs to be larger. Accordingly, the second spacer is deposited on PFET structures to provide the required extra spacing.

Figure 7A:
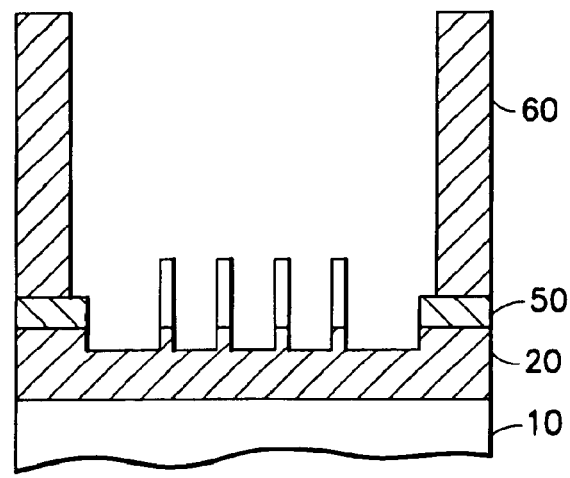
Figure 7B:
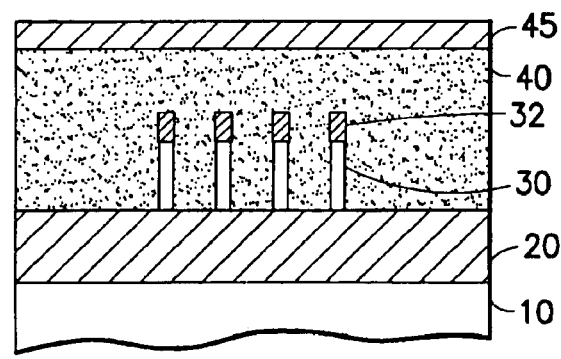
Figure 7C:
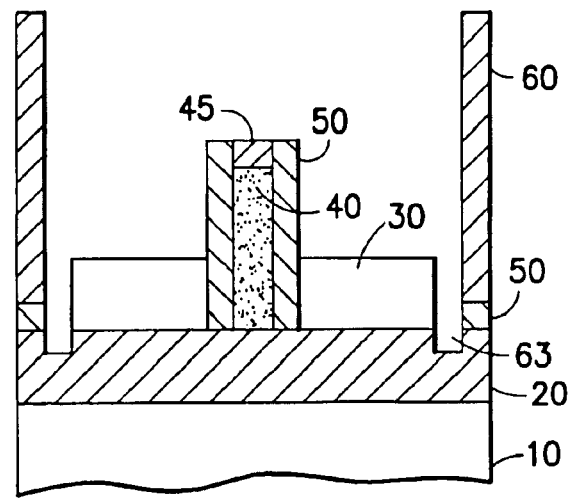

If the optional oxide spacers are not used, the oxide 32 on top of the fin silicon can be removed at this point. This is an option, not a necessary step. FIGS. 7A and 7C show the removal of oxide 32 and also an aperture cut into the BOX as a result of the oxide etch. Protecting the BOX to avoid this aperture is not necessary, as it does not affect the operation of the FinFET. Oxide 32 remains in FIG. 7B, as it is covered by the poly 40.

FIG. 8 shows the beginning of the selfaligned source/drain formation. There are several different options to form the source/drain elements of the transistors:

1. Deposit undoped CVD polysilicon and planarize it stopping on the oxide. 2. Grow selective epitaxial silicon and planarize it at the same level. 3. Grow epitaxial silicon between the fins (Preferred range 50 Å B 500 Å, depending on fin to fin distance), process a silicide on the grown silicon, deposit a contact liner (e.g. TiN) and then fill up with metal (e.g. CVD tungsten) and planarize. Instead of silicon it is also possible to use silicon-germanium. The last option (Metal fill) is the best for device performance, since it has low external resistance. The first option (Polysilicon fill) is the cheapest. It is also possible to process the source/drain regions of NFETs and PFETs separately, giving the option of using in situ doped processes for the poly deposition and the selective epitaxy, meaning n-doped silicon for the NFET and p-doped silicon for the PFET. In this case the extensions can also be formed by solid phase outdiffusion from the silicon.

Figure 8A:
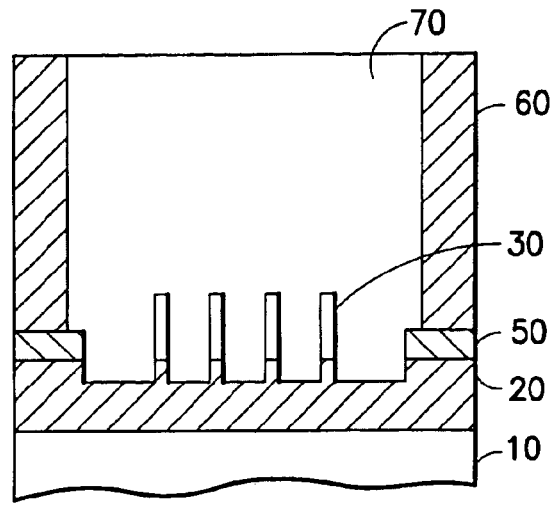
Figure 8B:
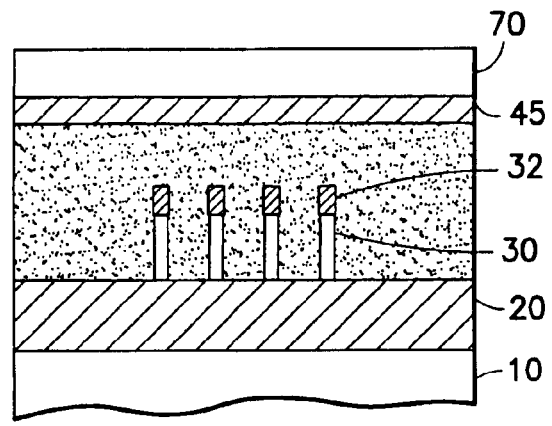
Figure 8C:
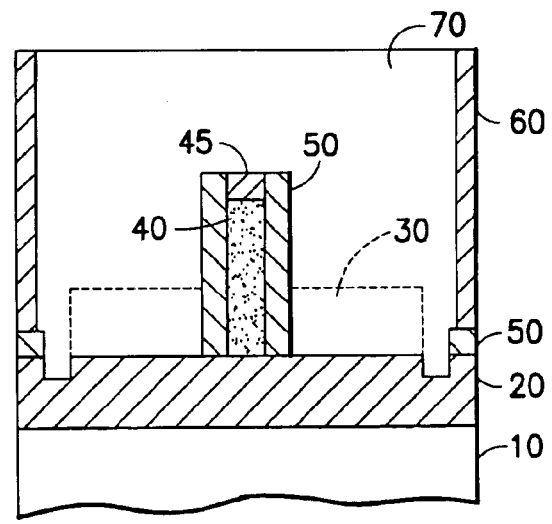

FIG. 8A shows the formation of S/D material 70, filling the aperture. FIG. 8B shows a thinner layer reflecting the height of the oxide 60. FIG. 8C shows the S/D material covering the gate 40 (which is encapsulated by the nitride liner).

FIG. 9 shows the result of recessing the source/drain material 70 deposited in the previous step by a plasma etch or wet etch to a height that is still covering the top of the fin 30. The purpose of this recess is to reduce the source/drain capacitance by removing the S/D material 70 where it does not contribute to a reduction of the external resistance. Ideally the recess would stop on top of the fin.

Figure 9A:
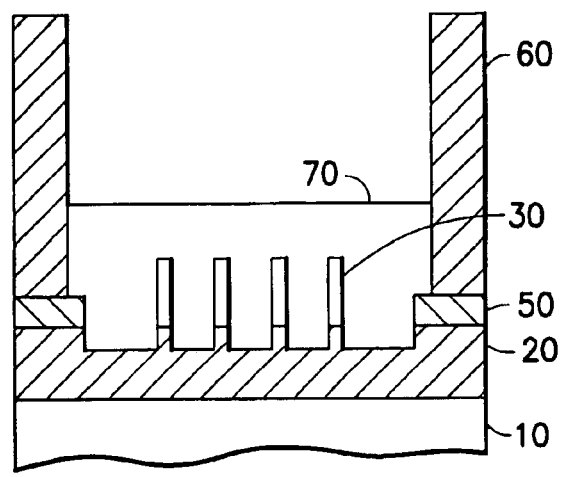
Figure 9B:
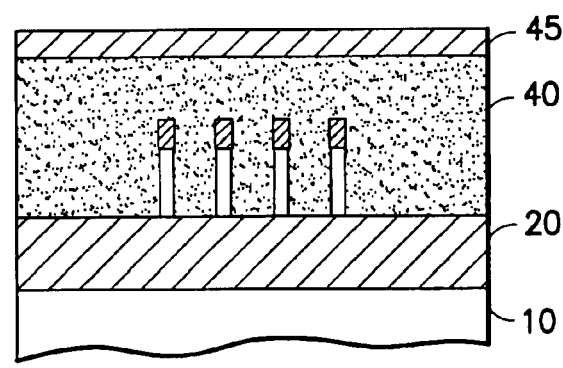
Figure 9C:
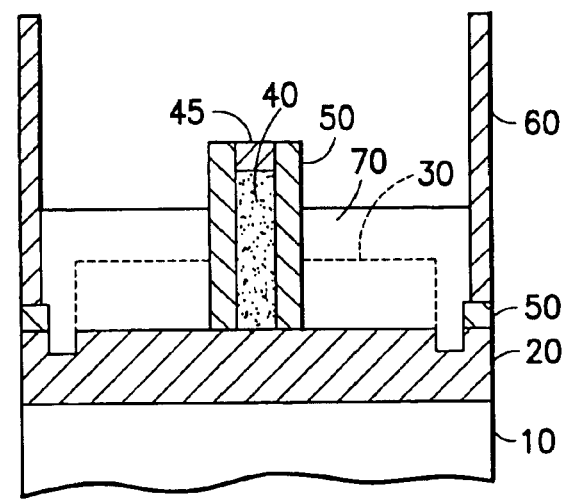

FIG. 9A shows a solid block of recessed poly providing a large surface for placing a contact to the S/D. FIG. 9C shows the gate separated from the S/D by spacer 50. FIG. 9B shows the remaining portion of nitride 45 as the top layer.

Figure 10A:
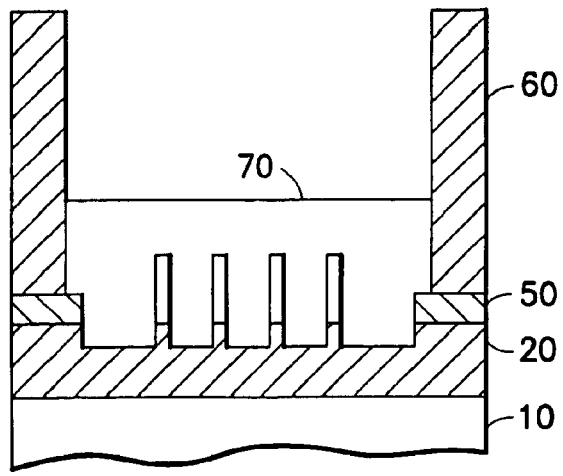
Figure 10B:
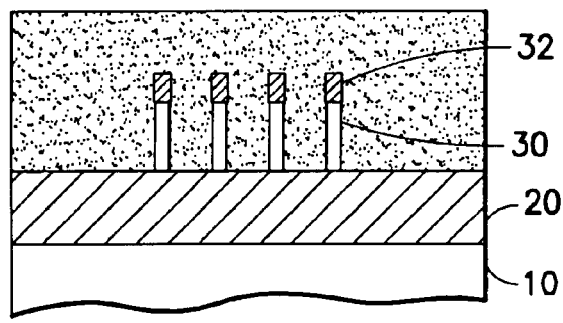
Figure 10C:
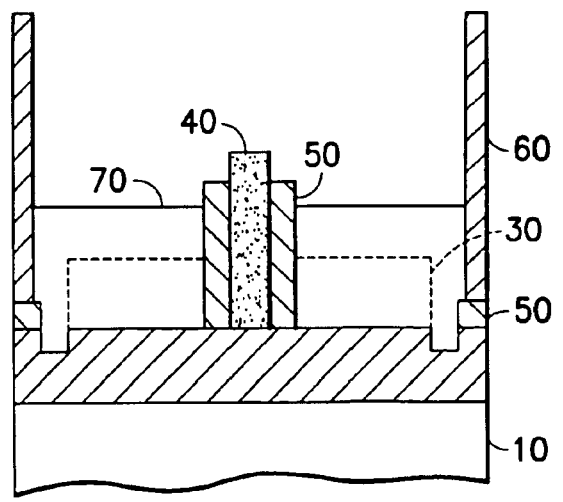

In FIG. 10, the nitride cap 45 on top of the gate is removed by an anisotropic RIE etch, exposing the top surface of the poly gate 40.

Figure 11A:
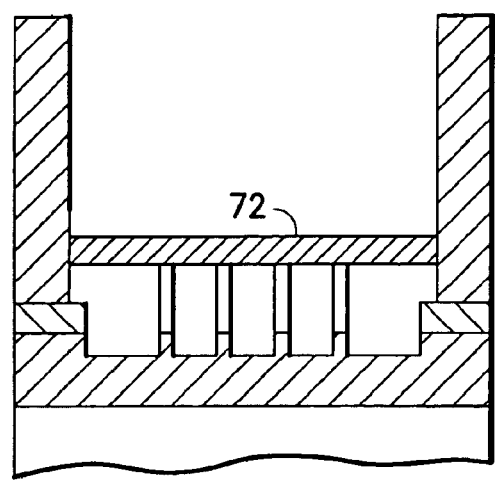
Figure 11B:
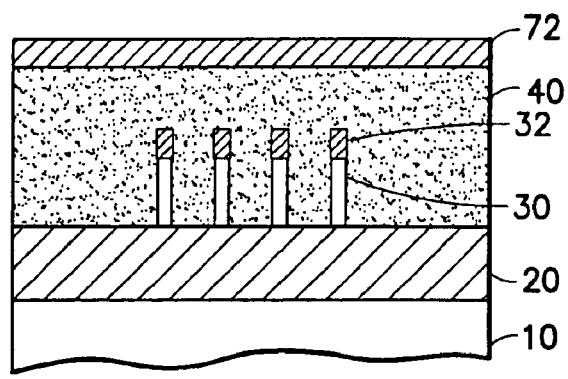
Figure 11C:
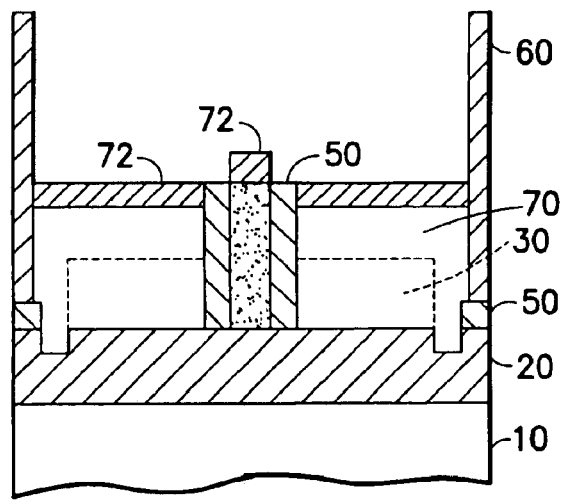

In FIG. 11, the source and drain blocks, also the gate, are doped by an ion implant, separately for NFET and PFET, followed by a silicidation process (Ni, Co, Y) that form a suicide on the S/D blocks and also on the top of the gate 40. At this point the process could continue with a standard integrated circuit fabrication process, starting with CVD oxide deposition and formation of contacts and metal wiring.

The following material describes an embodiment that offers the integration of a fully silicided gate process into the selfaligned source/drain process flow.

Figure 12A:
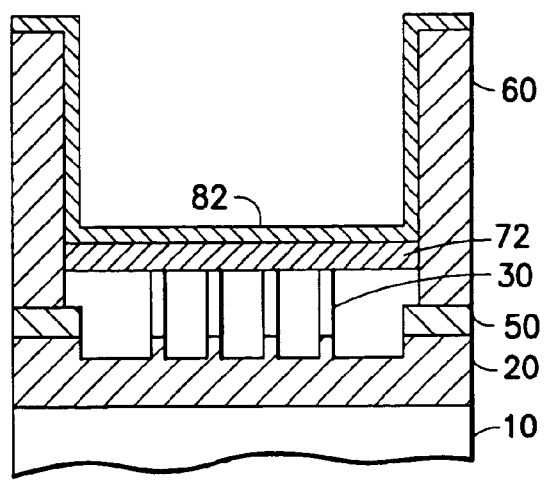
FIGS. 12–16 illustrate steps in an optional gate silicidation process.
Figure 12B:
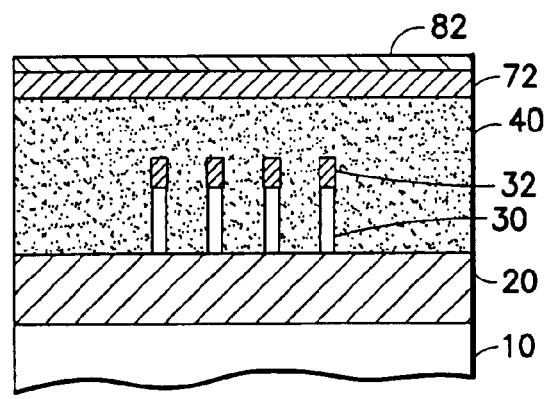
Figure 12C:
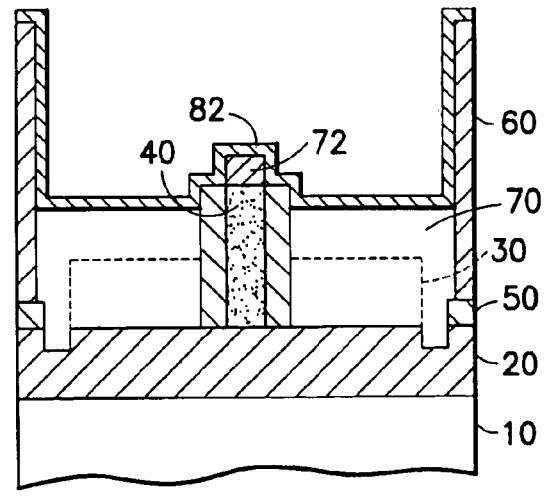

A 100 Å conformal CVD nitride film 82 (Preferred range 50 Å B 500 Å) is deposited after the previous silicide step, covering the FinFETs and oxide 60, FIG. 12

Figure 13A:
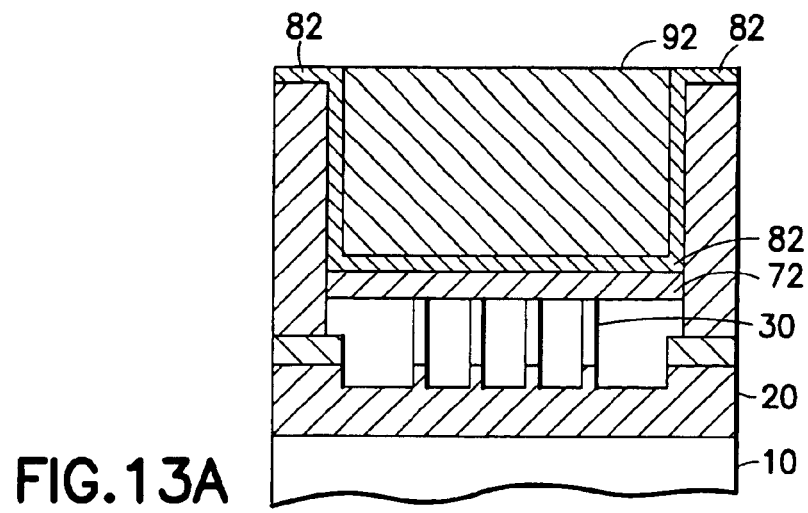
Figure 13B:
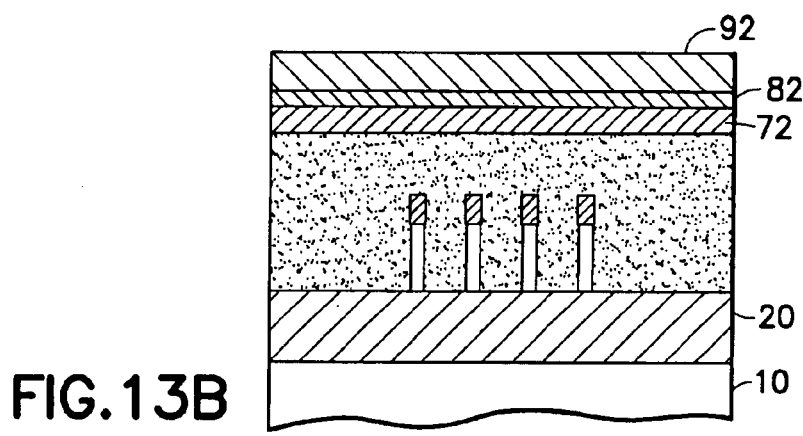
Figure 13C:
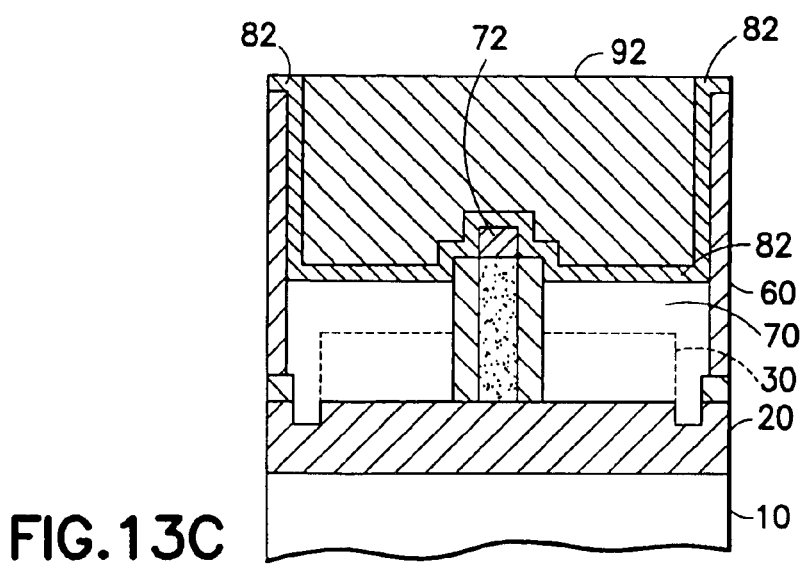

Then a CVD oxide 92 is deposited on top of the nitride 82. The oxide film is thicker than the height difference between gate and source/drain area. The oxide is planarized by CMP or any other planarization technique to the height of oxide 60 and nitride 82, FIG. 13.

Figure 14A:
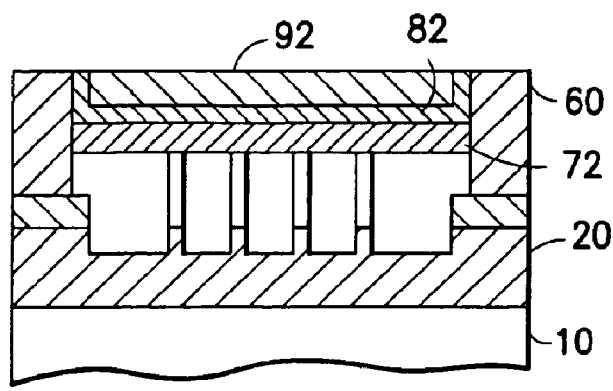
Figure 14B:
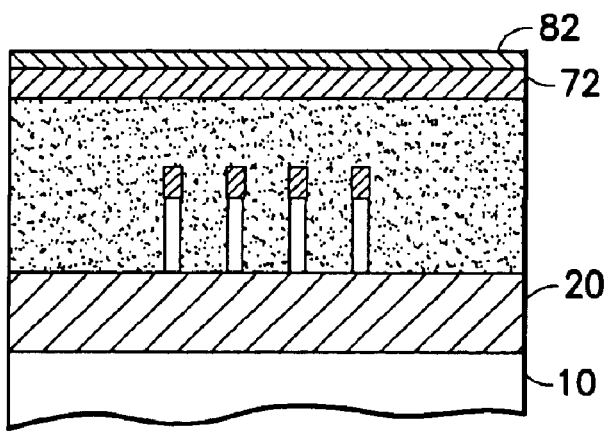
Figure 14C:
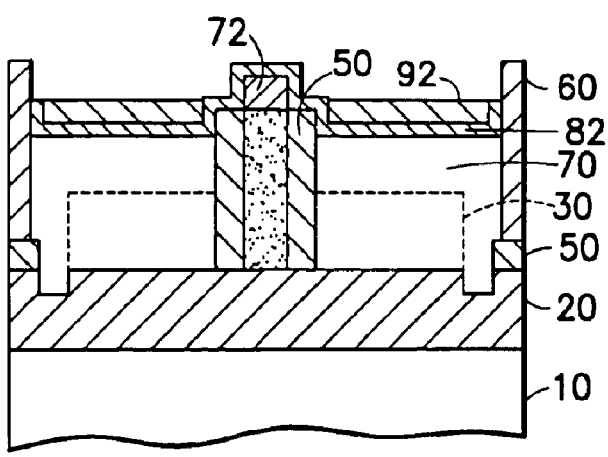

Exposed portions of nitride 82 on top of oxide 92 are stripped (e.g. hot phosphoric acid), then oxide 92 is recessed by plasma etch back or wet etch selective to nitride so that the upper part of the gate is cleared from the oxide. Another process option would be to do an oxide CMP selective to nitride, stopping on the gate nitride cap (FIG. 14).

Figure 15A:
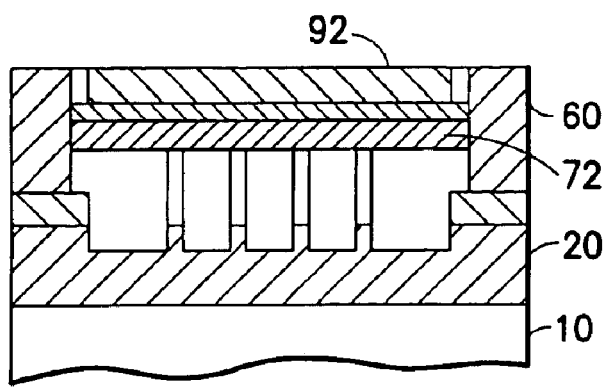
Figure 15B:
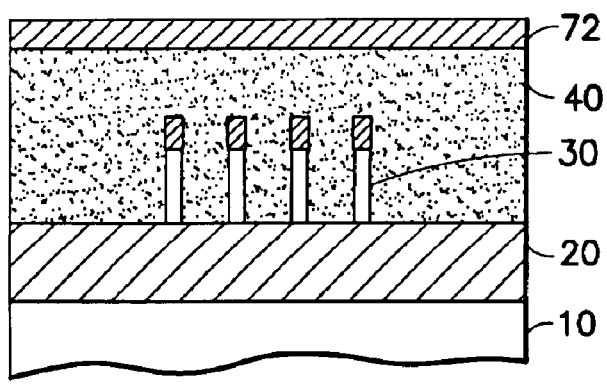
Figure 15C:
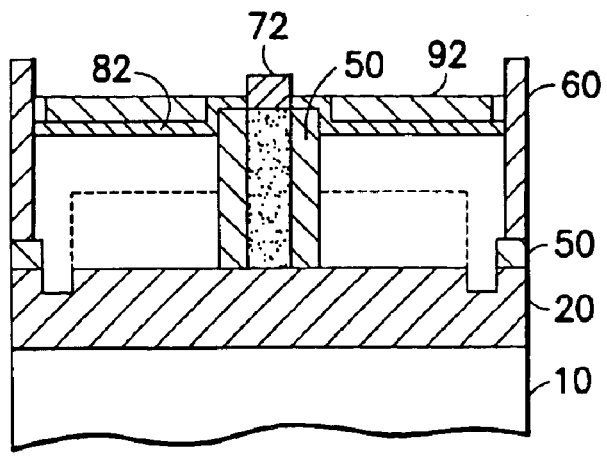

In FIG. 15 the nitride cap is removed by plasma etch or by wet etch extending down along the gate sidewalls formed by nitride 50 to BOX 20, leaving a narrow aperture 41 visible in FIG. 15C.

Figure 16A:
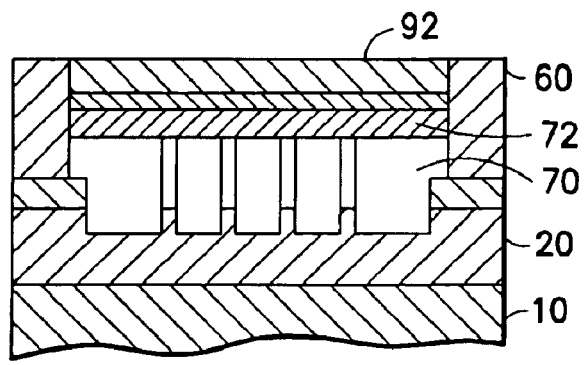
Figure 16B:
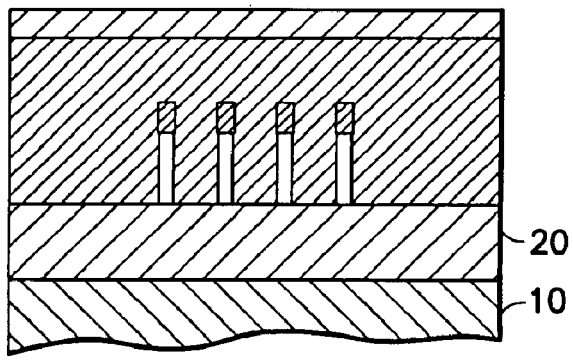
Figure 16C:
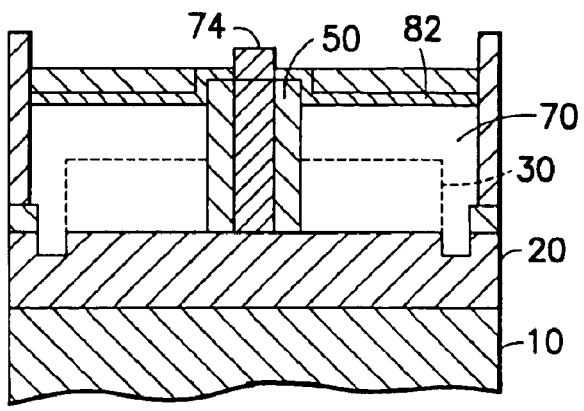

In FIG. 16 the gate is fully silicided, extending vertically down to BOX 20, preferably using Ni, while the fins and S/D are protected by the CVD oxide 92. Co is an optional choice for silicidation. In this case of a full silicidation of the gate, an additional Ni deposition and anneal is necessary to convert the entire gate poly into silicide.

The process optionally then continues with a standard integrated circuit formation process and back end processes in other portions of the circuit, as described above.

Those skilled in the art will appreciate that the various deposition and etching steps are conventional. The use of silicon is not required and any semiconductor may be used. Different combinations of etch-susceptible and etch-resistant materials may be used. Conventional planar FETs may be included in the circuit, if the designer chooses.

While the invention has been described in terms of a single preferred embodiment, those skilled in the art will recognize that the invention can be practiced in various versions within the spirit and scope of the following claims.

What is claimed is:

1. A method of forming a FinFET, comprising the steps of:

forming a set of at least one semiconducting fin on a substrate;

forming a gate insulator on said set of fins;

depositing a layer of gate material over said set of fins;

forming a hardmask on said gate material extending perpendicular to said set of fins and having a hardmask thickness;

etching said gate material outside said hardmask down to said substrate, thereby forming a gate intersecting said set of fins and defining a body region in said fins below said gate;

depositing a conformal layer of insulator enclosing said gate;

performing an anisotropic etch of said conformal layer, thereby exposing said set of fins while said gate remains covered by said conformal layer of insulator by depositing a source/drain material over a set of at least two fins after said anisotropic etch of said conformal layer, thereby making contact with sides of said at least two fins and forming a FinFET having at least two fins;

forming source and drain regions in said fins, separated from said gate by said conformal layer of insulator; and depositing a blocking material over a set of FinFET locations and opening an aperture over a subset of locations for a first polarity of FinFETs;

depositing a second conformal insulating layer over gates in said locations for a first polarity of FinFETs, said second layer having a separation thickness combined with said first layer such that dopant material in sources and drains of said first polarity of FinFETs are separated from said gates.

2. A method according to claim 1, in which:

said hardmask thickness is such that a remaining layer of said hardmask remains above said gate after said anisotropic etch when said fins are exposed by removing said conformal layer of insulator down to said substrate.

3. A method according to claim 1, in which said fins and said gate are formed from silicon and further comprising the steps of:

exposing silicon in said fins and in an upper portion of said gate; and performing a silicidation step of said exposed silicon.

4. A method of forming a FinFET, comprising the steps of:
forming a set of at least one semiconducting fin on a substrate;
forming a gate insulator on said set of fins;
depositing a layer of gate material over said set of fins;
forming a hardmask on said gate material extending perpendicular to said set of fins and having a hardmask thickness;
etching said gate material outside said hardmask down to said substrate, thereby forming a gate intersecting said set of fins and defining a body region in said fins below said gate;
depositing a conformal layer of insulator enclosing said gate;
performing an anisotropic etch of said conformal layer, thereby exposing said set of fins while said gate remains covered by said conformal layer of insulator; and
forming source and drain regions in said fins, separated from said gate by said conformal layer of insulator by depositing a source/drain material over a set of at least two fins after said anisotropic etch of said conformal layer, thereby making contact with sides of said at least two fins and forming a FinFET having at least two fins;
further comprising a step of depositing a blocking material over FinFET locations and opening an aperture over locations for a first polarity of FinFETs;
depositing a second conformal insulating layer over gates in said locations for a first polarity of FinFETs, said second layer having a separation thickness combined with said first layer such that dopant material in sources and drains of said first polarity of FinFETs are separated from said gates.

5. A method according to claim 4, further comprising the steps of:
depositing a source/drain material over a set of at least two fins after said anisotropic etch of said conformal layer, thereby making contact with sides of said at least two fins and forming a FinFET having at least two fins.

6. A method according to claim 5, in which;
said hardmask thickness is such that a remaining layer of said hardmask remains above said gate after said anisotropic etch when said fins are exposed by removing said conformal insulating layer down to said substrate.

7. A method according to claim 5, in which said fins, said S/D material and said gate are formed from silicon and further comprising the steps of:
exposing silicon in said fins and S/D material and in an upper portion of said gate; and
performing a silicidation step of said exposed silicon.

8. A method according to claim 7, further comprising a step of:
after said step of silicidation, removing said conformal layer over said gate, thereby forming an aperture between said gate and said S/D material having a vertical exposed silicon gate surface; and
performing a step of silicidation on said exposed gate surface.

9. A method of forming a FinFET, comprising the steps of:
forming a set of at least one semiconducting fin on a substrate;
forming a gate insulator on said set of fins;
depositing a layer of gate material over said set of fins;
forming a hardmask on said gate material extending perpendicular to said set of fins and having a hardmask thickness;
etching said gate material outside said hardmask down to said substrate, thereby forming a gate intersecting said set of fins and defining a body region in said fins below said gate;
depositing a conformal layer of insulator enclosing said gate;
performing an anisotropic etch of said conformal layer, thereby exposing said set of fins while said gate remains covered by said conformal layer of insulator; and
forming source and drain regions in said fins, separated from said gate by said conformal layer of insulator in which said fins, said S/D material and said gate are formed from silicon;
said hardmask thickness is such that a remaining layer of said hardmask remains above said gate after said anisotropic etch when said fins are exposed by removing said conformal insulating layer down to said substrate;
and further comprising the steps of:
exposing silicon in said fins and S/D material and in an upper portion of said gate; and
performing a silicidation step of said exposed silicon.

10. A method according to claim 9, further comprising a step of:
after said step of silicidation, removing said conformal layer over said gate, thereby forming an aperture between said gate and said S/D, material having a vertical exposed silicon gate surface; and
performing a step of silicidation on said exposed gate surface.

11. A method of forming a FinFET,
comprising the steps of:
forming a set of at least one semiconducting fin on a substrate;
forming a gate insulator on said set of fins;
depositing a layer of gate material over said set of fins;
forming a hardmask on said gate material extending perpendicular to said set of fins and having a hardmask thickness;
etching said gate material outside said hardmask down to said substrate, thereby forming a gate intersecting said set of fins and defining a body region in said fins below said gate;
depositing a conformal layer of insulator enclosing said gate;
performing an anisotropic etch of said conformal layer, thereby exposing said set of fins while said gate remains covered by said conformal layer of insulator; and
forming source and drain regions in said fins, separated from said gate by said conformal layer of insulator by depositing a source/drain material over a set of at least two fins after said anisotropic etch of said conformal layer, thereby making contact with sides of said at least two fins and forming a FinFET having at least two fins, in which said fins, said S/D material and said gate are formed from silicon and further comprising the steps of:
exposing silicon in said fins and S/D material and in an upper portion of said gate; and
performing a silicidation step of said exposed silicon.

12. A method according to claim 11, further comprising a step of:

after said step of silicidation, removing said conformal layer over said gate, thereby forming an aperture between said gate and said S/D material having a vertical exposed silicon gate surface; and performing a step of silicidation on said exposed gate surface.

13. An integrated circuit comprising at least one FinFET comprising:

a set of at least one semiconducting fin(s) on a substrate;

said set of fins having a gate insulator separating a body region thereof from a selfaligned gate formed by etching a layer of gate material disposed over said set of fins outside a hardmask down to said substrate, thereby forming a gate intersecting said set of fins and defining said body region in said fins below said gate;

a separation layer of insulator enclosing said gate and formed by an anisotropic etch of a conformal layer, that exposed said set of fins while said gate remained covered by said separation layer of insulator; and source and drain regions in said fins, selfaligned to said gate and separated from said gate by said separation layer of insulator, in which a first subset of N-type FinFETs has a first thickness of said separation layer and a second subset of P-type FinFETs has a second thickness of separation layer, said second thickness being greater than said first thickness.

* * * * *